United States Patent [19]

Decoster et al.

[11] Patent Number: 4,652,335
[45] Date of Patent: Mar. 24, 1987

[54] PROCESS FOR PRODUCING A PHOTOELECTRIC DETECTOR OF THE HIGH-SENSITIVITY PHOTORESISTOR TYPE

[75] Inventors: Didier Decoster, Leers; Renaûd Fauquembergue, Carvin; Monique Constant, Villeneuve, all of France

[73] Assignee: Centre National de la Recherche Scientifique, Paris, France

[21] Appl. No.: 828,783

[22] Filed: Feb. 12, 1986

[30] Foreign Application Priority Data

Feb. 15, 1986 [FR] France ............................ 85 02258

[51] Int. Cl.⁴ .................. B44C 1/22; H01L 31/00; H01L 27/14; H01L 21/306
[52] U.S. Cl. ................................ 156/643; 29/572; 156/648; 156/655; 156/662; 357/30

[58] Field of Search ............... 29/572; 252/79.2, 79.4; 204/192 E; 156/643, 645, 648, 649, 655, 659.1, 662; 148/1.5; 357/17, 19, 30, 31, 55, 56, 65

[56] References Cited

U.S. PATENT DOCUMENTS 4,431,858 2/1984 Gonzalez et al. ............... 29/572 X
4,559,695 12/1985 Baker .............................. 29/572

Primary Examiner—William A. Powell
Attorney, Agent, or Firm—Poms, Smith, Lande & Rose

[57] ABSTRACT

This invention relates to a process for producing a photoelectric detector of the high-gain photoresistor type comprising on a substrate an active layer of doped gallium arsenide provided with two electrodes with ohmic contacts for connection to a user circuit, said process consisting in applying to the active layer a treatment producing a selective attack of the surface of said layer modifying its degree of compensation in gallium and in arsenic and the superficial charge states.

9 Claims, 8 Drawing Figures

PROCESS FOR PRODUCING A PHOTOELECTRIC DETECTOR OF THE HIGH-SENSITIVITY PHOTORESISTOR TYPE

The present invention relates to a process for producing a photoelectric detector of the photoresistor type comprising on a substrate an active layer of doped gallium arsenide provided with two electrodes with ohmic contacts for connection to a user circuit.

As is known, detection of the light energy with the aid of semiconductors is based on the fact that a photon of sufficient energy (greater than the forbidden band energy of the semiconductor in question) may create an electron-hole pair in the semiconductor. If an electric field prevails therein, the photo-excited carriers are carried and will produce a current which may be collected in an outside circuit: this is the photocurrent.

An interesting parameter giving an idea of the performances of the photodetector is the gain, and more particularly the outside gain which is defined as the number of electrical charges collected in the outside circuit by incident photon on the photodetector. This definition of the gain thus makes it possible to take into account both the losses by reflection on the surface of the active zone of the semiconductor and the internal quantum yield.

Photodetectors may be divided into two large categories, viz. photodiodes and photoresistors.

In a photodiode, an active photon produces only one electrical charge which may be collected in the outside circuit. The gain is therefore necessarily less than the unit. However, by reverse biasing photodiodes to a sufficiently high voltage, it is possible to take advantage of the phenomenon of avalanche in order to increase the gain. However, this is only of the order of 1,000 to 10,000 in the conventional avalanche photodiodes.

In a photoresistor, the electricity-conducting mechanisms are such that there may be a gain G whose value is given by the ratio between the life time $\tau_v$ of the photo-created carriers and their transit time $\tau_t$ to cover the interelectrode distance (the electrodes necessary for making contacts define this distance):

$$G = \frac{\tau_v}{\tau_t} \quad (1)$$

The physical principle of these photoresistors is fairly well known. For photoresistors made according to planar technology and using an active layer of N-type doped gallium arsenide (GaAs), the life time $\tau_v$ of the photo-created carriers is directly connected with the surface potential $\psi$ of the semiconductor material by the relation.

$$\tau_v = \tau_o \exp \frac{e\psi}{kT} \quad (2)$$

where $\tau_o$ represents the mean time necessary for the holes to traverse the space charge zone by thermal agitation, e is the charge of the electron, k is the Boltzmann constant and T the absolute temperature. In order to be able to detect very low light levels, the gain G, therefore the life time $\tau_v$ of the carriers must be increased. Formula (2) shows that it is necessary, to this end:

to avoid heating of the active layer by the Joule effect, and to increase its surface potential.

It is a particular object of the invention to define a process for increasing the sensitivity of a photoresistor of the type in question by increasing the natural surface potential of the gallium arsenide (GaAs) which constitutes the active layer thereof.

This process essentially consists in applying to said active layer a treatment producing a selective superficial attack of the atoms of said layer, this attack modifying its degree of compensation in gallium and arsenic and the superficial charge states. In this way, the natural surface potential of the semiconductor material, which corresponds to about e $\psi=0.4$ eV, may be increased to about its maximum theoretical value corresponding to half the energy of its forbidden band, viz. about 0.6 to 0.8 eV. The gain G varying, in accordance with relations (1) and (2), exponentially with the surface potential, such an increase leads to a considerable increase in the gain of the photoresistor, which may attain several orders of magnitude.

The above-mentioned treatment is advantageously a chemical treatment, preferably consisting in an immersion of the active layer in a solution composed:

of ammonia $NH_4OH$ (1 volume),
of hydrogen peroxide $H_2O_2$ (1 volume),
and of water $H_2O$ (100 volumes), for 20 seconds, at 25° C. and with stirring. This treatment, which probably involves processes of oxidoreduction implying phenomena of catalysis, causes the formation, on the surface of the semiconductor, of holes on the atomic scale, with the result that, on this surface, the atoms of arsenic take preponderant importance over the atoms of gallium, this creating a surface with considerable negative charge (without it being necessary, for example, to deposit a metal coating thereon and to take it to an appropriate potential).

Furthermore, with a view to reducing the obscurity current and therefore to avoid heating of the active layer by the Joule effect, a deep channel should be hollowed out in the active layer between the two contact electrodes, prior to the selective attack treatment. Thanks to the presence of this channel, which may be hollowed out by ionic machining, the obscurity current of the photoresistor is much weaker, this contributing to increasing the gain thereof.

The process according to the invention makes it possible to produce photoresistors whose gain may attain about $10^9$, as will be seen hereinbelow. Such photoresistors thus constitute a solid state version of the conventional photomultipliers used for detecting low light levels.

The invention will be more readily understood on reading the following description with reference to the accompanying drawings, in which.

Figure 5:
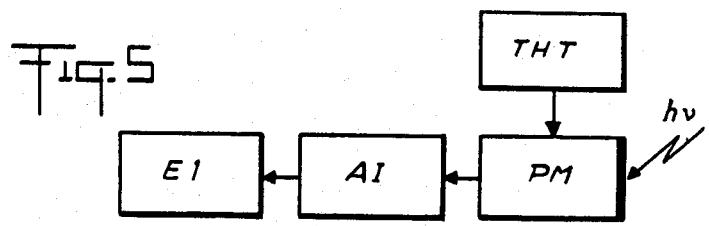
Figure 6:
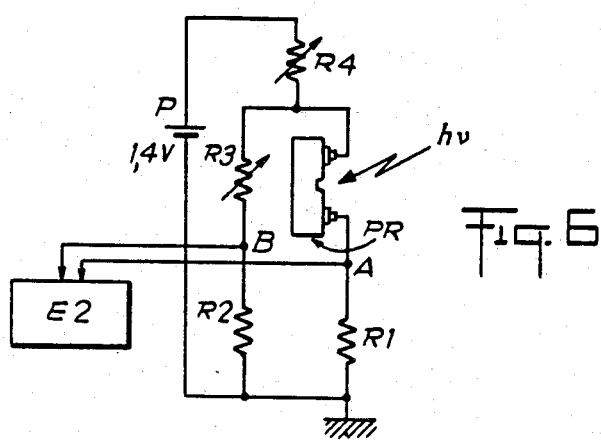

FIGS. 5 and 6 schematically show two light measuring assemblies respectively equipped with a photomultiplier and with a photoresistor according to the invention.

Figure 7:
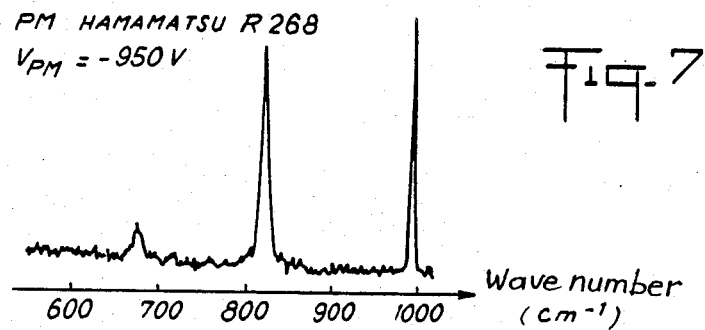
Figure 8:
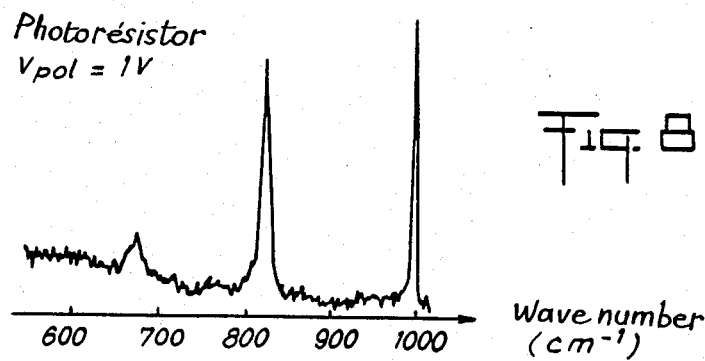

FIGS. 7 and 8 show Raman spectra recordings obtained respectively with the assemblies of FIGS. 5 and 6.

Figure 1:
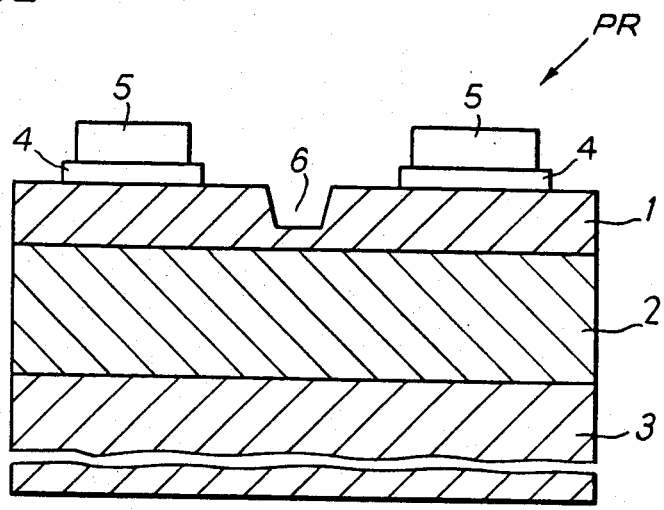
FIG. 1 shows, in considerably enlarged section, the structure of a photoresistor made in accordance with the process of the invention.

Referring now to the drawings, the photoresistor PR shown in FIG. 1 essentially comprises an electro-optically sensitive, active layer 1 borne by a substrate 3 with interposition of an intermediate layer 2. These three layers are made of gallium arsenide (GaAs). Layer 1, of thickness equal to 0.2 $\mu$m, is made of doped N-type GaAs (impurity ratio about $9.10^{16}$ at./cm$^3$); layer 2, of thickness equal to 4 $\mu$m, is a buffer layer of GaAs not intentionally doped (impurity ratio about $10^{14}$ at./cm$^3$), and layer 3, of thickness equal to 400 $\mu$m, is made of semi-insulating GaAs. On the free surface of layer 1 are formed two electrodes with ohmic contact, constituted by eutectic Au-Ge pellets 4 surmounted by gold studs 5 which allow connecting wires to be welded. The distance between the opposite edges of the two pellets 4 is equal to 10 $\mu$m.

Figure 2:
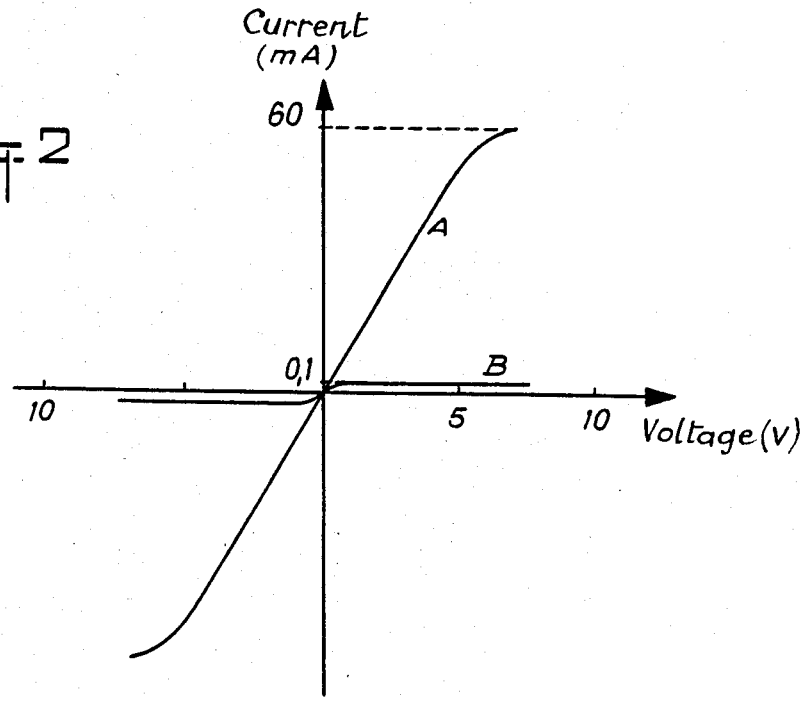
FIG. 2 shows the variations in the obscurity current of the photoresistor without and with hollowed out channel.

A channel 6 is hollowed out, by ionic treatment, in the active layer 1, between the contact electrodes 4, over a width of 3 $\mu$m and a depth of the order of half or two thirds of the thickness of said layer. The presence of this channel causes a considerable reduction of the obscurity current of the photoresistor, as shown in FIG. 2. The variations in the obscurity current as a function of the voltage applied to terminals 5 of the photoresistor follow curve A in the absence of channel 6 and curve B in the presence of this channel. It is seen, for example, that, for a voltage of 7.5 V, the obscurity current drops from 60 mA to 0.1 mA. The fact of hollowing out such a channel reduces heating of the component, thanks to the lowering of the obscurity current, hence the performances are improved.

Figure 3:
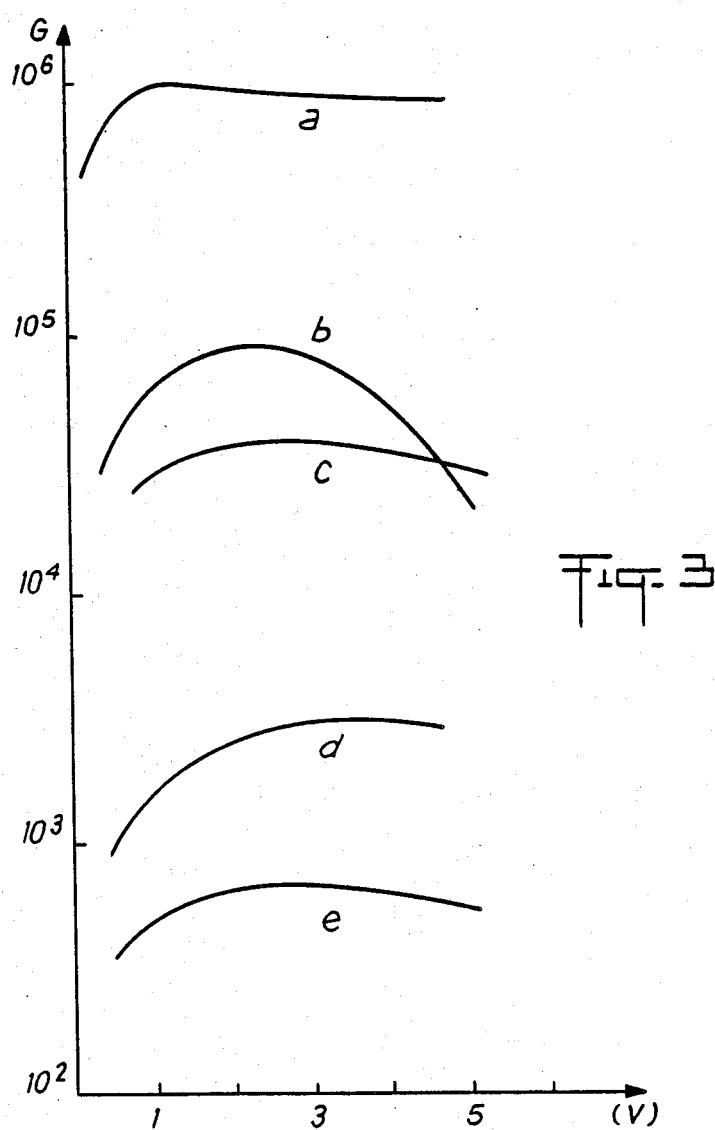
FIG. 3 shows the variations in the gain of photoresistors having undergone different treatments.

The gain G of a photoresistor thus produced as a function of the voltage applied to its terminals, for a light power of 100 nW, is given by curve c of FIG. 3. It is of the order of $3.10^4$.

The value of gain G may be increased in considerable proportions by subjecting the active layer 1 to a superficial treatment involving a selective chemical attack producing an increase in its surface potential. Different laboratory tests have shown that the best results are obtained by immersing the active layer for 20 seconds in a solution composed of 1 volume of NH$_4$OH and 1 volume of H$_2$O$_2$ in 100 volumes of water and maintained at 25° C. with stirring. This surface treatment modifies the degree of compensation of said surface in arsenic and gallium and its effect is to increase the negative surface charge, therefore to enhance the surface potential. The duration chosen ensures an effective attack whilst avoiding too great a modification of the thickness of the active layer. The temperature has been chosen in order to be under experimental conditions which are easy to reproduce. In addition, the precaution of stirring the bath is indispensable in order to obtain a uniform treatment.

By carrying out this chemical treatment on the active layer 1 where channel 6 has been hollowed out, under the same conditions of measurement, a gain of the order of $10^6$ is obtained (curve a of FIG. 3).

By way of examples, FIG. 3 also shows curve b (gain ranging from about $3.10^4$ to $10^5$), obtained after the chemical treatment defined hereinbove alone, without ionic treatment for hollowing out a channel; curve d (gain ranging from about $10^3$ to $3.10^3$) obtained with ionic treatment and chemical treatment, the treatment solution containing 15 volumes of NH$_4$OH (instead of 1 volume); and curve e (gain of the order of only $5.10^2$) with ionic treatment and chemical treatment by means of a solution containing, not ammonia, but phosphoric acid H$_3$PO$_4$ (15 volumes). In all cases, the temperature of the chemical treatment solution used is maintained at 25° C., the duration of immersion therein remaining equal to 20 seconds. As to the light power, it is, in each case, equal to 100 nW.

A comparative examination of these curves shows the considerable increase in gain brought by the combination of the ionic treatment (channel) and chemical treatment (superficial attack), as well as the importance presented by the respect of the conditions recommended for the chemical treatment, particularly concerning the composition of the solution.

Figure 4:
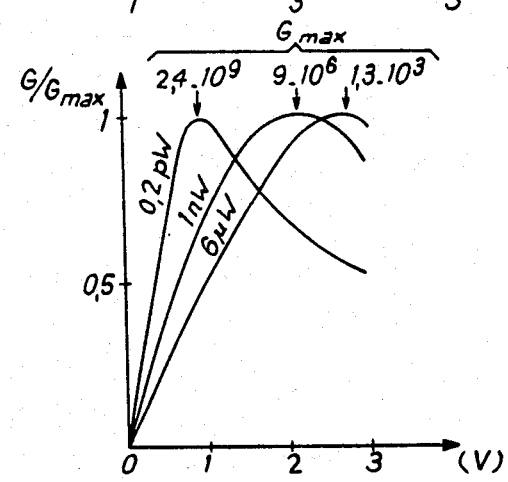
FIG. 4 shows the variations in the relative gain of a photoresistor treated according to the invention, for different incident light powers.

The gain of a photoresistor depends on the incident light power. If the gain of photoresistor PR produced with ionic and chemical treatment is close to $10^6$ under a light power of 100 nW (curve a of FIG. 3), its value may attain and exceed $10^9$ under lower incident powers. FIG. 4 shows curves indicating the variation in the relative gain G/G max for three values of light power (6 $\mu$W, 1 nW and 0.2 pW), the corresponding G max values being indicated in each case, namely $1.3 . 10^3$, $9.10^6$ and $2.4 . 10^9$ respectively.

It is seen that, for very low light powers, the gain G of photoresistor PR is comparable to that of a good photomultiplier. This result has been confirmed by comparative tests for obtaining Raman spectra with the aid, on the one hand, of a photomultiplier PM, on the other hand, of a photoresistor PR according to the invention.

Photomultiplier PM (FIG. 5), connected to a source of THT supply, delivers a signal which is applied, via an amplifier-integrator AI, to a recorder E1.

Photoresistor PR (FIG. 6) is mounted in a bridge whose arms are constituted by resistors R1, R2, R3 and the photoresistor itself, this bridge being supplied, via a resistor R4, by a battery P of 1.4 V. The effect of the obscurity current is compensated by adjusting the resistor R3 whilst the value of resistors R1 and R2 is 12 ohms. The signal taken at points A and B is applied to a recorder E2 identical to recorder E1.

Photomultiplier PM (of the Hamamatsu R 268 type) and photoresistor PR are used successively as photodetector at the output of the same spectrometer receiving the Raman scattering of a sample of molybdenum oxide MoO$_3$ excited by laser. FIGS. 7 and 8 show the spectra respectively obtained (between about 550 and 1000 cm$^{-1}$), as recorded. It is immediately apparent that the results furnished by the photoresistor, associated with the battery P and some resistors, are comparable to those procured by the photomultiplier, associated with its stabilized THT supply and with the amplifier-integrator AI.

It will be noted in particular that the relative intensities of the lines are the same in the two spectra, which are obtained with a signal-to-noise ratio of the same order of magnitude. It is interesting to note, in addition, that the output signal of the photomultiplier (some nA) requires an amplification and filtering, whilst the one delivered by the photoresistor ($10^{-3}$ to $10^{-5}$ A) undergoes no treatment. Moreover, in the low-frequency domain, the noise of the photoresistor does not seem greater than that of the photomultiplier.

In conclusion, it is seen that the photoresistor hollowed out and treated chemically in accordance with the invention presents continuous gains comparable to those of a high-quality photomultiplier, to which it may be considered as equivalent and which it may advantageously replace, thus allowing a considerable saving in equipment, bulk and electrical supply power.

What is claimed is:

1. A process for producing a photoelectric detector of the photoresistor type comprising on a substrate an active layer of doped gallium arsenide provided with two electrodes with ohmic contacts for connection to a user circuit, said process comprising applying to said active layer a treatment producing a selective attack of the surface of said layer modifying its degree of compensation in gallium and in arsenic and the superficial charge states.

2. The process of claim 1, wherein said treatment is a chemical treatment.

3. The process of claim 2, wherein the chemical treatment comprises immersing said active layer in a solution containing:
   ammonia $NH_4OH$ (1 volume),
   hydrogen peroxide $H_2O_2$ (1 volume),
   and water $H_2O$ (100 volumes) for 20 seconds, at 25° C. and with stirring.

4. The process of claim 1 wherein, prior to the selective attack treatment, a deep channel is hollowed out in the active layer between the two contact electrodes.

5. The process of claim 2 wherein, prior to the selective attack treatment, a deep channel is hollowed out in the active layer between the two contact electrodes.

6. The process of claim 3 wherein, prior to the selective attack treatment, a deep channel is hollowed out in the active layer between the two contact electrodes.

7. The process of claim 4, wherein the channel is hollowed out by ionic machining.

8. The process of claim 5, wherein the channel is hollowed out by ionic machining.

9. The process of claim 6, wherein the channel is hollowed out by ionic machining.